(12) United States Patent
Hussell et al.

(10) Patent No.: US 7,968,900 B2
(45) Date of Patent: Jun. 28, 2011

(54) HIGH PERFORMANCE LED PACKAGE

(75) Inventors: Christopher P. Hussell, Cary, NC (US);
David T. Emerson, Chapel Hill, NC (US); Michael J. Bergmann, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 381 days.

(21) Appl. No.: 11/624,954

(22) Filed: Jan. 19, 2007

(65) Prior Publication Data
US 2008/0173883 A1   Jul. 24, 2008

(51) Int. Cl.
*H01L 33/00* (2010.01)

(52) U.S. Cl. .............. 257/99; 257/98; 257/E23.055; 257/E23.506; 257/E23.509

(58) Field of Classification Search .......... 257/98, 257/99, 100, E33.058, E33.059, E33.061, 257/E33.067, E33.072, 101, 102, 103; 349/65
See application file for complete search history.

(56) References Cited

U.S. PATENT DOCUMENTS

| | | | |
|---|---|---|---|
| 5,993,075 A | 11/1999 | Huang et al. | |
| 6,066,861 A | 5/2000 | Hoehn et al. | |
| 6,345,903 B1 | 2/2002 | Koike et al. | |
| 6,561,660 B2 | 5/2003 | Huang | |
| 6,642,547 B2 * | 11/2003 | Matsubara et al. | 257/98 |
| 6,674,096 B2 | 1/2004 | Sommers | |
| 6,677,707 B1 * | 1/2004 | Dietiker | 313/498 |
| 6,730,942 B2 * | 5/2004 | Mabuchi et al. | 257/100 |
| 6,930,332 B2 * | 8/2005 | Hashimoto et al. | 257/98 |
| 6,936,862 B1 | 8/2005 | Chang et al. | |
| 7,029,935 B2 * | 4/2006 | Negley et al. | 438/29 |
| 7,084,941 B2 | 8/2006 | Suen et al. | |
| 7,098,588 B2 | 8/2006 | Jager et al. | |
| 7,115,979 B2 | 10/2006 | Park et al. | |
| 7,157,746 B2 * | 1/2007 | Ota et al. | 257/100 |
| 7,164,148 B2 * | 1/2007 | Yoshida et al. | 257/13 |
| 7,183,706 B2 * | 2/2007 | Ellens et al. | 313/503 |
| 7,304,326 B2 * | 12/2007 | Suehiro et al. | 257/79 |
| 7,355,284 B2 * | 4/2008 | Negley | 257/778 |
| 7,417,220 B2 * | 8/2008 | Suehiro et al. | 250/239 |
| 7,531,294 B2 * | 5/2009 | Yamamoto et al. | 430/311 |
| 7,649,209 B2 * | 1/2010 | Hussell et al. | 257/98 |
| 2002/0063301 A1 | 5/2002 | Hanamoto et al. | |

(Continued)

FOREIGN PATENT DOCUMENTS

EP    1 246 265 A2    10/2002

(Continued)

OTHER PUBLICATIONS

U.S. Appl. No. 60/745,478, filed Apr. 24, 2006.

(Continued)

*Primary Examiner* — Leonardo Andújar
*Assistant Examiner* — William Harriston
(74) *Attorney, Agent, or Firm* — Koppel, Patrick, Heyhl & Philpott

(57) ABSTRACT

A light emitting diode lamp is disclosed that includes a resin package that defines a recess in the shape of a solid polygon or another three-dimensional solid. The recess includes a floor, two side walls along the respective longer sides of the floor, and two end walls along the respective shorter sides of the floor. The two side walls define an angle therebetween greater than 3°, and the two end walls define an angle therebetween greater than 40°. A light emitting diode chip is positioned on the rectangular floor of the package.

30 Claims, 4 Drawing Sheets

U.S. PATENT DOCUMENTS

| | | | |
|---|---|---|---|
| 2002/0063520 A1 | 5/2002 | Yu et al. | |
| 2003/0122139 A1 | 7/2003 | Meng et al. | |
| 2003/0147257 A1* | 8/2003 | Lee | 362/561 |
| 2004/0080268 A1 | 4/2004 | Ueda | |
| 2004/0121502 A1* | 6/2004 | Summers et al. | 438/47 |
| 2004/0140765 A1 | 7/2004 | Takekuma | |
| 2004/0159850 A1* | 8/2004 | Takenaka | 257/98 |
| 2004/0173810 A1 | 9/2004 | Lin et al. | |
| 2004/0223339 A1 | 11/2004 | Tsuei et al. | |
| 2005/0017259 A1 | 1/2005 | Han et al. | |
| 2005/0077532 A1* | 4/2005 | Ota et al. | 257/98 |
| 2005/0199884 A1 | 9/2005 | Lee et al. | |
| 2005/0205974 A1 | 9/2005 | Su et al. | |
| 2005/0221519 A1 | 10/2005 | Leung | |
| 2005/0277216 A1* | 12/2005 | Asakawa | 438/22 |
| 2006/0023451 A1 | 2/2006 | Han et al. | |
| 2006/0050526 A1 | 3/2006 | Ikeda et al. | |
| 2006/0097621 A1 | 5/2006 | Park et al. | |
| 2006/0131601 A1* | 6/2006 | Ouderkirk et al. | 257/99 |
| 2006/0170083 A1 | 8/2006 | Kim et al. | |
| 2006/0193121 A1 | 8/2006 | Kamoshita | |
| 2006/0220050 A1 | 10/2006 | Higaki et al. | |
| 2006/0267040 A1 | 11/2006 | Baek et al. | |
| 2006/0270078 A1 | 11/2006 | Kim et al. | |
| 2008/0074884 A1* | 3/2008 | Mok et al. | 362/294 |
| 2008/0142820 A1* | 6/2008 | Edmond et al. | 257/98 |
| 2008/0191224 A1* | 8/2008 | Emerson et al. | 257/98 |
| 2009/0250710 A1* | 10/2009 | Negley | 257/89 |

FOREIGN PATENT DOCUMENTS

| | | |
|---|---|---|
| EP | 1 246 265 A3 | 10/2002 |
| EP | 1 641 049 | 3/2006 |
| JP | 06 177428 | 6/1994 |
| WO | 2006127030 | 11/2006 |

OTHER PUBLICATIONS

U.S. Appl. No. 60/824,385, filed Sep. 1, 2006.
U.S. Appl. No. 60/824,390, filed Sep. 1, 2006.
European Patent Office—Annex to Form PCT/ISA/206, Communication Relating to the Results of the Partial International Search, International Application No. PCT/US2008/051039, Date of Mailing Jun. 2, 2008; 2 pages.
International Search Report of foreign counterpart application PCT/US2008/051039; mailed Nov. 4, 2008; 2 pages.

* cited by examiner

HIGH PERFORMANCE LED PACKAGE

BACKGROUND

The present invention relates to light emitting diodes and in particular relates to packaged light emitting diodes that emit white light.

Light emitting diodes (LEDs) are a class of photonic semiconductor devices that convert an applied voltage into light by encouraging electron-hole recombination events in an appropriate semiconductor material. In turn, some or all of the energy released in the recombination event produces a photon.

Light emitting diodes share a number of the favorable characteristics of other semiconductor devices. These include generally robust physical characteristics, long lifetime, high reliability, and, depending upon the particular materials, low cost.

A number of terms are used herein that are common and well-understood in the industry. In such industry use, however, these terms are sometimes informally blended in their meaning. Accordingly, these terms will be used as precisely as possible herein, but in every case their meaning will be clear in context.

Accordingly, the term "diode" or "chip" typically refers to the structure that minimally includes two semiconductor portions of opposite conductivity types (p and n) along with some form of ohmic contacts to permit current to be applied across the resulting p-n junction.

The term "lamp" is used to designate a light emitting diode that is matched with an appropriate electrical contact and potentially a lens to form a discrete device that can be added to or included in electrical circuits or lighting fixtures or both.

As used herein, the term "package" typically refers to the placement of the semiconductor chip on an appropriate physical and electrical structure (sometimes as simple as a small piece of metal through which the electrical current is applied) along with a plastic lens (resin, epoxy, encapsulant) that provides some physical protection to the diode and can optically direct the light output. In the present context, the package includes a reflective structure, frequently formed of a polymer with in which the diode rests. Adding a lens and electrical contacts typically forms a lamp.

Appropriate references about the structure and operation of light emitting diodes and diode lamps include Sze, PHYSICS OF SEMICONDUCTOR DEVICES, 2d Edition (1981) and Schubert, LIGHT-EMITTING DIODES, Cambridge University Press (2003)

The color emitted by an LED is largely defined by the material from which it is formed. Diodes formed of gallium arsenide (GaAs) and gallium phosphide (GaP) tend to emit photons in the lower energy (red and yellow) portions of the visible spectrum. Materials such as silicon carbide (SiC) and the Group III nitrides have larger bandgaps and thus can generate photons with greater energy that appear in the green, blue and violet portions of the visible spectrum as well as in the ultraviolet portions of the electromagnetic spectrum.

In some applications, an LED is more useful when its output is moderated or converted to a different color. In particular, as the availability of blue-emitting LEDs has greatly increased, the use of yellow-emitting phosphors that down-convert the blue photons has likewise increased. Specifically, the combination of the blue light emitted by the diode and the yellow light emitted by the phosphor can create white light. In turn, the availability of white light from solid-state sources provides the capability to incorporate them in a number of applications, particularly including illumination and as lighting (frequently backlighting) for color displays. In such devices (e.g., flat computer screens, personal digital assistants, and cell phones), the blue LED and yellow phosphor produce white light which is then distributed in some fashion to illuminate the color pixels. Such color pixels are often formed by a combination of liquid crystals color filters and polarizers, and the entire unit including the backlighting is generally referred to as a liquid crystal display. ("LCD").

In the present application, the term "white light" is used in a general sense. Those familiar with the generation of colors and of color perception by the human eye will recognize that particular blends of frequencies can be defined as "white" for precise purposes. Although some of the diodes described herein can produce such precise output, the term "white" is used somewhat more broadly herein and includes light that different individuals or detectors would perceive as having a slight tint toward, for example, yellow or blue.

As noted above with respect to displays, light emitting diodes are increasingly being used for illumination purposes. In this regards, "indication" refers to a light source that is viewed directly as a self-luminous object (e.g. an indicator light on a piece of electronic equipment) while "illumination" refers to a source used to view other objects in the light reflected by those objects (e.g., room lighting or desk lamps). See, National Lighting Product Information Program, http://www.lrc.rpi.edu/programs/NLPIP/glossary.asp (December 2006).

Illumination, however, tends to require higher quantities of light output than does indication. In this regard, the number of individual photons produced by a diode in any given amount of time depends upon the number of recombination events being generated in the diode, with the number of photons generally being less than the number of recombination events (i.e., not every event produces a photon). In turn, the number of recombination events depends upon the amount of current applied across the diode. Once again the number of recombination events will typically be less than the number of electrons injected across the junction. Thus, these electronic properties can reduce the external output of the diode.

Additionally, when photons are produced, they must also actually leave the diode and the lamp to be perceived by an observer. Although the majority of photons will leave the lamp without difficulty, a number of well-understood factors come into play that prevent the photons from leaving and that can thus reduce the external output of an LED lamp (i.e., its efficiency). These include internal reflection of a photon until it is re-absorbed rather than emitted. The difference in the index of refraction between the materials in the diode can also change the direction of an emitted photon towards an object that subsequently absorbs it. The same results can occur for yellow photons that are emitted by the phosphor in a phosphor-containing LED lamp. In an LED lamp such "objects" can include the substrate, parts of the packaging, the metal contact layers, and any other material or element that prevents the photon from escaping the lamp.

As noted above, white light LEDs are increasingly being used to light displays for electronic devices. In many of these applications, the LEDs are mounted perpendicular to the face of the relevant screen. In this orientation, and instead of being directed at the rear of the screen itself, the LEDs are directed towards the edges of a light guide—often a planar piece of plastic—so that when the light from the LEDs enters the edge of the light guide, the light guide both diffuses the light and redirects some of it perpendicularly towards the plane of the display screen.

Light emitting diodes packaged for this purpose are referred to as side view surface mount LEDs or "sidelookers." The conventional package for a side-view (sidelooker) diode lamp is molded out of a white plastic resin in a shape that forms a cavity around a metal strip (which forms the lead frame for a diode mounted in the package). The cavity generally defines sidewall angles between the respective sides. In the most common packages, the sidewall angles are near-perpendicular to the surface (floor) upon which the chip is mounted.

Although display lighting represents a frequent use of sidelooker LEDs, sidelooker applications are not limited to displays or horizontal orientations. Similarly, although many displays are back-lit, the invention is useful with other lighting geometries or arrangements as well.

It is commonly assumed that white plastic material is a true Lambertian (diffuse) reflector; i.e. it scatters light equally in all $2\pi$ steradians. Accordingly, conventional packages tend to maximize the size of the package floor (the back inside surface of the cavity in the package) in order to make it easier to position the LED chip in the package (i.e., more room). To the extent that any such assumptions are inaccurate, however, the effective output of the LED lamp will suffer accordingly.

In this regard, a specular surface is one that is mirror-like, while a Lambertian surface is one that follows Lambert's cosine law and thus demonstrates the same luminance regardless of the viewing angle. It will thus be understood (as is understood by those of ordinary skill in this art) that any given surface is usually somewhere on a continuum from perfectly specular to perfectly Lambertian.

In short summary, a number of factors can reduce the external light output of an LED lamp. Accordingly, a need exists for continued improvement in increasing the external output of such LED lamps.

SUMMARY

In one aspect, the invention is a light emitting diode lamp comprising a resin package that defines a recess in the shape of a solid polygon, with the recess comprising a floor, side walls along the respective longer sides of the floor, and end walls along the respective shorter sides of the floor. The recess has a geometry selected from the group consisting of (i) the side walls defining an angle therebetween greater than 3°, (ii) the end walls defining an angle therebetween greater than 40°, and (iii) combinations thereof. A light emitting diode chip is on the floor of the package.

In another aspect, the invention is a light emitting diode lamp comprising a resin package that defines a recess in the shape of a solid polygon, with the recess comprising a rectangular floor, at least two sidewalls along the respective longer sides of the rectangular floor, and two end the walls along the respective shorter sides of the rectangular floor. The two sidewalls define an angle greater than three degrees (3°), and the two end walls define an angle greater than 40°. A light emitting diode chip is positioned on the rectangular floor of the package.

In another aspect, the invention is a light emitting diode lamp comprising a resin package with an aspect ratio greater than 1:1 that defines a recess in the shape of a three dimensional solid, the recess comprising a floor with an aspect ratio greater than 1:1, curved side walls along the respective longer sides of the floor, and curved end walls along the respective shorter sides of the floor. The package defines a first plane bisecting the package along its long axis and a second plane bisecting said package along its narrow axis. The recess has a geometry selected from the group consisting of (i) the side walls defining an angle therebetween and along the second plane greater than 3°, (ii) the end walls defining an angle therebetween and along the first plane greater than 40°, and (iii) combinations thereof. A light emitting diode chip is on the floor of said package.

In another aspect, the invention is a reflective structure for diode lamps. In this aspect, the invention is a package having at least one face that is substantially rectangular, a package defining a recess in the form of a solid polygon having a floor parallel to the rectangular face, two sidewalls along the respective longer edges of the rectangular face, two end walls along the respective shorter edges of the rectangular face, and a surface co-planer with the rectangular face. The sidewalls define an angle that is greater than 3°, or the end walls define an angle that is greater than 40°, or both. The floor of the reflective structure includes electrical contacts.

In yet another aspect, the invention is a method of backlighting a display. In this aspect the invention includes the steps of directing the light from a light emitting diode against two package walls that are separated by at least the dimensions of the diode and which walls form an angle between themselves of at least 3°, while concurrently directing the light from the light emitting diode against two other package walls that are separated by at least the dimensions of the diode and which walls form an angle between themselves that is greater than 40°, and while directing the light from the four package walls to a light distributor that provides a backlight for a display.

The foregoing and other objects and advantages of the invention and the manner in which the same are accomplished will become clearer based on the followed detailed description taken in conjunction with the accompanying drawings.

DETAILED DESCRIPTION

In contrast to conventional thinking, it has now been discovered that typical plastic packages for light emitting diodes are non-Lambertian, i.e., a noticeable specular component exists and should be considered for package reflector design. Additionally, it has been found that rotating the approximately $2\pi$ steradian reflection more towards the outside of the package increases the overall output; and that opening (i.e., increasing) the angles of the corners of the cavity tends to reduce the number of multiple reflections before light escapes.

Figure 1:
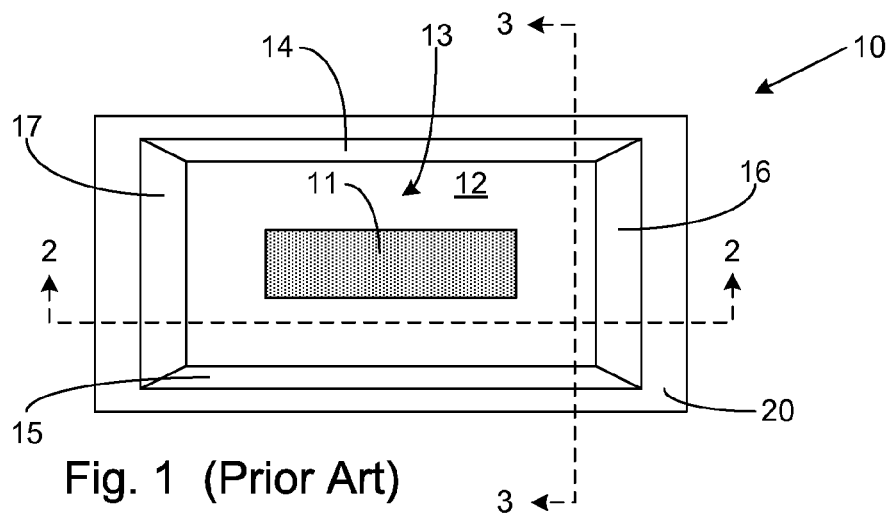
FIG. 1 is a top plan view of a diode package exemplary of the prior art.
Figure 2:
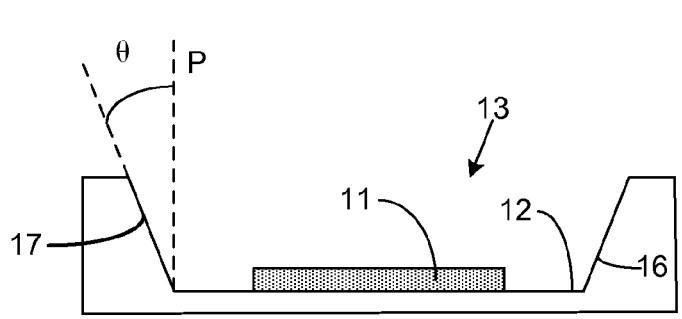
FIG. 2 is a cross-sectional view taken along lines 2-2 of FIG. 1.
Figure 3:
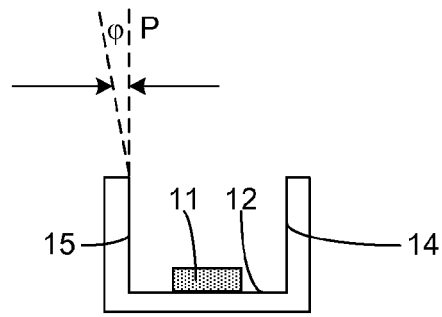
FIG. 3 is a cross-sectional view taken along lines 3-3 of FIG. 1.

A number of aspects of the invention can be understood in comparison to the prior art. Accordingly, FIGS. 1, 2 and 3 illustrates typical conventional packages. These figures are simplified somewhat from the appearance of commercial packages in order to focus upon the aspects most relevant to the art and to the invention. Representative fixtures are, however, widely available commercially and frequently addressed in the prior art, including prior patents and published applications. Accordingly, those of ordinary skill in this art will recognize the relevant aspects without undue experimentation or explanation.

FIG. 1 illustrates a generally rectangular package broadly designated at 10. FIG. 1 is a top plan view and shows the light emitting diode chip 11 on the floor 12 of a recess broadly designated at 13. The recess 13 is defined by the floor 12, the respective sidewalls 14 and 15, the respective end walls 16 and 17, and a surface in space coplanar with the front surface 20 of the package 10. As FIG. 1 illustrates, the conventional design provides a relatively large floor 12 in comparison to the area covered by the chip 11 which, given the relatively small size of some of these devices makes it somewhat easier during fabrication steps to position the LED chip 11 on the floor 12.

The orientation of the package and its recess will be clear in context. As a colloquial note, however, the specification and claims refer to the rear portion of the package upon which the LED rests as the "floor." It will be understood that some users will refer to this same surface as the "inside back surface" of the package. Similarly, the specification and claims use the term "side" to describe those walls perpendicular to the floor. In some colloquial use, these are sometimes referred to as the "top" and "bottom" of the package, because when the lamp is mounted in the sidelooker orientation, these walls are positioned above and below the LED chip. For the sake of clarity, electrical contacts to the outside of the packages are not illustrated in FIGS. 4-6.

As will be illustrated in FIGS. 8-14, some exemplary packages according to the invention are not necessarily rectangular in a proper geometric sense. They are, however, generally rectangular in that they have length and width dimensions that are obviously different from one another. In order to describe these shapes without misusing the term "rectangular," the packages can be described as having an aspect ratio greater than 1:1 and in many cases greater than 5:1. In exemplary embodiments, the aspect ratio is between about 3:1 and 7:1. As used herein, the term "aspect ratio" refers to the ratio of the longer overall dimension to the narrower overall dimension.

FIGS. 2 and 3 schematically illustrate conventionally inclined package walls 16 and 17 adjacent the floor 12. It will also be understood that in many circumstances the lamp 10 will include a lens formed of a clear resin that fills (or partially fills) the recess 13. This aspect is shown with respect to FIG. 7, but has been omitted from FIGS. 1-3 for purposes of clarity.

It will be further understood that some prior art packages are generally, rather than precisely, rectangular in the manner just described.

In general, conventional packages have an angle between the respective walls 16 and 17 of less than about 40°, meaning that the angle theta ($\theta$) in FIG. 2 between the sidewalls 17 and a line P perpendicular to the floor 12 will typically be less than about 20°.

It will be understood, however, that in order to accommodate a wire bond or other features, the side walls or end walls, although adhering to the overall angles described herein, are not necessarily identical on each side. For example, a 40° angle between walls can be formed by one wall being 23° from the perpendicular line P and the other wall being 17° degrees from the perpendicular line P. The steeper wall gives more room for the wire bond.

Similarly, FIG. 3 illustrates in exaggerated fashion that the angle between the end walls 14 and 15 is typically no more than about 2°, meaning that the angle phi ($\phi$) between sidewalls 15 and a line perpendicular to the floor 12 is no more than about 1°.

As noted above and in the Background, conventional design assumes that the package is Lambertian in character and thus equally reflective; that the angle at which the walls are inclined does not generally matter and that maximizing the size of the floor 12 is advantageous for fabrication purposes.

Although the inventors do not wish to be bound by any particular theory, it appears that the larger angles described herein tend to favor Lambertian emitters such as the EZBRIGHT™ diodes from Cree, Inc. referred to elsewhere herein. Similarly, the intermediate angles tend to favor the less or non-Lambertian emitters. Accordingly, the invention provides a package in which the angle between the relevant walls complements the emission field profile of the chip to produce greater light output than would otherwise be the case.

These benefits have not previously been observed because most conventional designs were originally for non-Lambertian emitters and the larger angles offer some, but less noticeable, improvement for such non-Lambertian emitters. As a second reason, conventional thinking tends to optimize the floor space to make placement and bonding of the chip easier.

In the invention, however, the tighter angles and smaller floor space can actually improve manufacturing accuracy because the die bonding tends to become self-aligning. As the chip is put into the package, it tends to properly align itself against the side walls as it is pushed down into the package during the bonding step.

Figure 4:
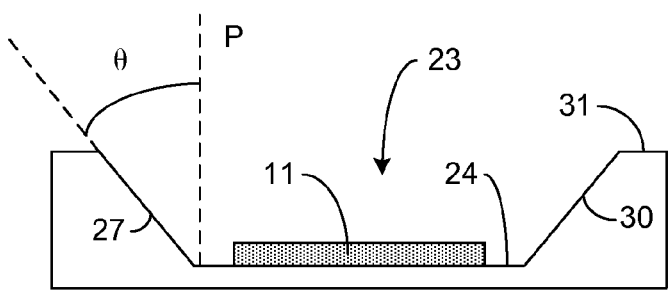
FIGS. 4, 5 and 6 are respective cross-sectional and top plan views of a package according to the invention taken in the same relationship to one another as FIGS. 1, 2 and 3.
Figure 5:
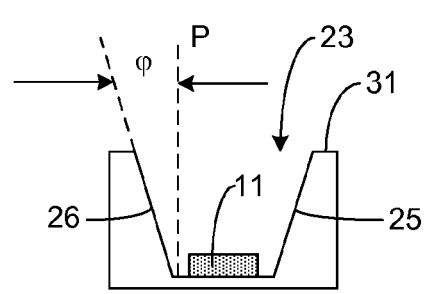
Figure 6:
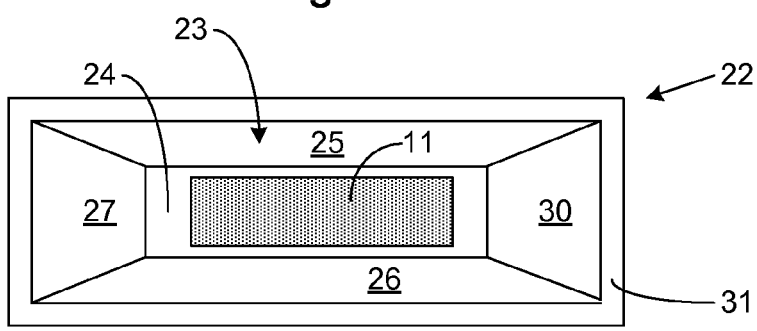

FIGS. 4, 5 and 6 illustrate aspects of a light emitting diode lamp according to the invention. In this aspect, the diode lamp includes a resin package broadly designated at 22. The package 22 defines a recess broadly designated at 23 in the shape of a solid polygon. The recess 23 includes a rectangular floor 24, two sidewalls 25 and 26 along the respective longer sides of the rectangular floor 24 and two end walls 27 and 30 along the respective shorter sides of the rectangular floor 24. The face of the package 31 defines the final side of the polygon recess 23.

The two sidewalls 25, 26 define an angle therebetween greater than 3°. This is illustrated in FIG. 5 in which the angle phi would represent half of the total angle between the walls 25 and 26 because phi as illustrated is the angle between one of the walls (26) and a line P perpendicular to the floor 12. In other words, in the invention the angle phi is least 1.5°.

As noted above, however, the invention is not limited to symmetric end walls or side walls. Thus, the angle between the side walls can be more than 3° even if the orientation of the side walls with respect to the floor is not symmetric.

It will be understood that the geometry of the respective angles can be described in a number of ways using ordinary and well-understood definitions. Thus, if the angle phi between the wall 26 and the perpendicular line is at least 1.5°, then the obtuse angle between the floor 12 and the wall 26 will be at least 91.5°. Accordingly, the acute angle between the wall 26 and the floor 24 will not exceed 88.5°. All of these describe the same relationship, depending upon the lines used to define them. In other embodiments, if the angle between the end walls is relatively large, the angle between the side walls can be somewhat smaller.

FIG. 4 shows that the two end walls 27 and 30 define an angle between them of more than 40°, meaning that in FIG. 4 the angle theta between the wall 27 and the perpendicular line will be at least 20°. As with the side walls, the end walls can be asymmetric and still define an angle greater than 40° between them.

The lamp structure includes the light emitting diode chip again numbered at 11 on the floor 24 of the package 22. In exemplary embodiments, the diode is in the "flip chip" orientation and potentially includes a reflecting layer or a reflective substrate. The EZBRIGHT™ diodes available from Cree, Inc., Durham, N.C., the assignee of the present invention are exemplary and include the flip chip orientation with the reflector and a silicon support substrate.

Figure 7:
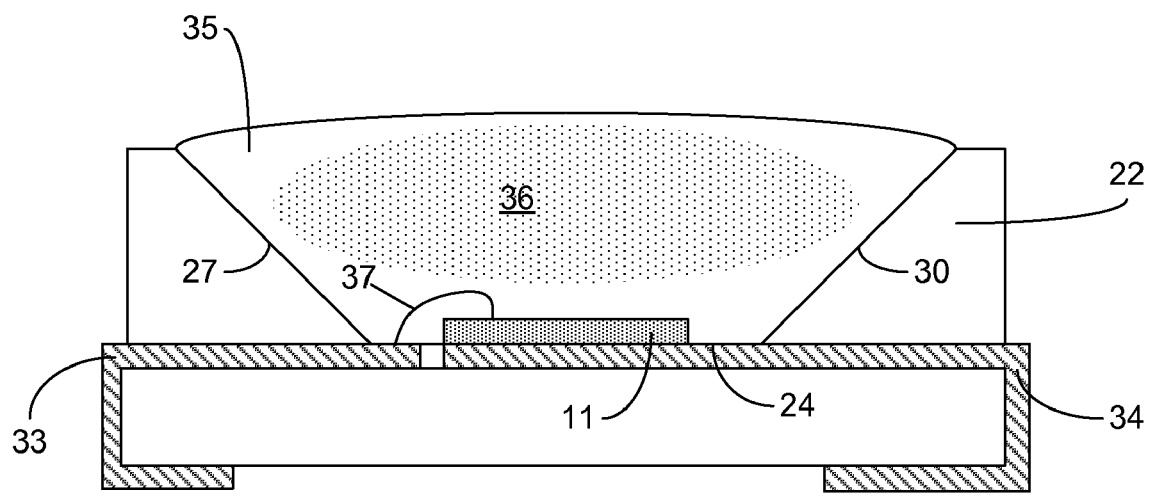
FIG. 7 is another cross-sectional view of a diode lamp according to the present invention.

FIG. 7 illustrates some additional features in a lamp of this type. Where appropriate, like elements in FIG. 7 carry the same reference numerals as in the previous drawings. In particular, FIG. 7 illustrates a lamp broadly designated at 32 in which the package broadly designated again at 22 also includes respective electrical contacts 33 and 34 between the rectangular floor 24 and at least one of the outside surfaces of the package 22. The diode 11 rests upon the contact 34 (and is typically fixed to it with an adhesive such as silicone, silver epoxy, or solder) and a wire 37 connects the diode 11 to the other contact 33. As is well understood in the art, these contacts as well as other related elements such as bond pads and solders (not shown) can take the form of multiple layers or combinations of metals and alloys.

The lamp 32 further comprises a resin encapsulant 35 in at least portions of the recess formed by the walls 25, 26, 27, 30.

Because one of the useful applications of the lamp of the invention is to provide white light, the encapsulant 35 is selected from a material that is stable in the presence of the blue light typically emitted by the diode chip 11. Thus, the encapsulant can be any material that is suitable for the purposes of the invention and that does not otherwise interfere with the operation of the LED chip or the other elements of the lamp. As set forth in co-pending and commonly assigned application Ser. No. 60/824,385 filed Sep. 1, 2006 for, "Phosphor Position In Light Emitting Diodes," when the LED chip emits in the higher energy portions of the spectrum (e.g., blue, violet, and ultraviolet), the encapsulant should be less reactive or inert to the photons emitted at such frequencies. Thus, the polysiloxane ("silicone") resins tend to be particularly well suited for the encapsulant. In general, the term polysiloxane refers to any polymer constructed on a backbone of —(—Si—O—)n- (typically with organic side groups). The term "resin" is used in a broad sense to refer to any polymer, copolymer or composite from which the package can be formed. These materials are generally well understood by those of ordinary skill in the art and need not be discussed in detail.

FIG. 7 also illustrates that in order to use blue light from the diode chip 11 to produce white light, the lamp 32 typically includes a phosphor 36 in the encapsulant 35. FIG. 7 shows the phosphor 36 schematically distributed in the form of an ellipse, but it will be understood that the phosphor can be distributed in a number of different orientations in order to enhance light output. Some of these are set forth in co-pending and commonly assigned U.S. pending applications Nos. 60/745,478 filed Apr. 26, 2006 for, "Side View Surface Mount White LED," and 60/824,385 filed Sep. 1, 2006 for, "Phosphor Position in Light Emitting Diodes." The contents of these applications are incorporated entirely herein by reference.

Additionally, although FIG. 7 illustrates the encapsulant 35 as forming a somewhat convex lens, the shape of the lens can take other forms some of which are set forth in commonly assigned and co-pending application No. 60/824,390 filed Sep. 1, 2006 for, "Encapsulant Profile for Light Emitting Diodes." The contents of this application are incorporated entirely herein by reference.

As set forth in the Background, in order to produce white light from the blue emission of the LED chip 11, the phosphor is selected to emit predominately in the yellow portion of the visible spectrum in response to blue light. The relevant phosphors are relatively broad emitters (i.e., a range of colors), but those used most frequently in the context of white-emitting lamps have a strong yellow component. An exemplary phosphor is cesium-doped yttrium aluminum garnet ("YAG") which is generally well understood and widely available.

Similarly, in order to produce light within the blue portion of the visible spectrum, the light emitting diode 11 typically includes an active portion formed from a wide bandgap material such as a Group III nitride or silicon carbide (SiC). Group III nitrides are generally preferred for this purpose because their direct bandgap produces efficient radiative recombinations. The nature of Group III nitrides and their use in light emitting diodes is generally well understood in the art and with respect to the present invention, can be practiced without undue experimentation. Section 8.4 of Shubert, supra is one exemplary source of information, and numerous patents and published applications likewise cover this subject in detail.

The package 22 is typically formed of a resin that is white in color or that includes a white pigment such as titanium dioxide ($TiO_2$) or barium sulfate ($BaSO_4$). Because the light emitting diode 11 will generate both heat and light, the resin should be stable in the presence of both for an acceptable lifetime. Accordingly, robust polymers such as the polyamides or reinforced polyamides (e.g. with glass or ceramic) are useful for this purpose. Representative resins include the Amodel® glass reinforced polyphthalamide ("PPA") resins from Solvay Advanced Polymers of Alpharetta Ga. and the Genestar™ nonanediamine polyamide resins available from Kuraray Co., Ltd., Tokyo, Japan. It will be understood that these are exemplary rather than limiting, and that other resins are appropriate provided they offer the desired reflective properties, appropriate physical strength, the capability of being molded (or otherwise formed) relatively easy during fabrication steps, and the required resistance to the heat and light produced by typical blue-emitting LEDs.

In another aspect, the invention is a method of backlighting a display. In this aspect, the method comprises directing the light from the light emitting diode 12 against two package walls 25 and 26 that are separated by at least the dimensions of the diode 11 and which walls form an angle between themselves of at least 3° while concurrently directing the light from the light emitting diode 11 against two other package walls 27 and 30 that are separated by at least the dimensions of the diode and which walls form an angle between themselves of at least 40°, and while directing the light from the four package walls 25, 26, 27 and 30 to a light distributor that provides a backlight for display. In particular, the method comprises directing the light from the package walls to at least one edge of a substantially planar light distributor to thereby illuminate the distributor from the light emitting diode.

Further to this aspect, the method can comprise manipulating a liquid crystal display adjacent the light distributor while directing light from the light emitting diode to the distributor.

In other embodiments, the side walls 25, 26 define an angle greater than 10°, or greater than 20°, or at least 30°.

In other embodiments the end walls 27, 30 can define an angle of at least 60°, or at least 70°, or at least 80°.

Although FIG. 7 illustrates the phosphor 36 as being dispersed in the polymer lens above the diode 11, it will be understood that the placement of the phosphor is not limited to these positions. The phosphor can be placed in some circumstances directly on the chip 11, or at the border (inside surface) of the lens, or in any other position or pattern that serves the intended purpose. Stated differently, the reflective mounting substrate offers its advantages in combination with a wide possibility of placements of the phosphor 36.

FIGS. 8 through 13 are top plan views of packages according to the present invention. These are generated in machine drawing style and thus the diagonal lines are indicative of curved surfaces rather than multiple flat surfaces. As an introduction, FIG. 8 will be labeled in greater detail and the elements of FIGS. 9-13 will be the same, but labeled in less detail.

Figure 8:
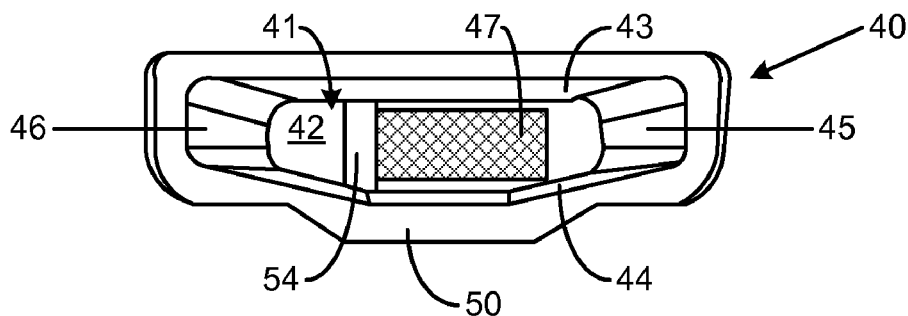

FIG. 8 accordingly illustrates a resin package broadly designated at 40 that defines a recess broadly designated at 41 in the shape of a three-dimensional solid. The recess 41 includes the floor 42, the sidewalls 43 and 44 along the respective longer sides of the floor (which is generally, but not exactly, rectangular) and respective curved end walls 45 and 46 along the respective shorter sides of the floor 42.

The recess 41 has a geometry selected from the group consisting of sidewalls 43 and 44 defining an angle therebetween greater than 3°, or a geometry with the end walls 45 and 46 defining an angle therebetween greater than 40°, or, a combination of both of those features; i.e. the sidewalls 43, 44 defining an angle greater than 3° and the end walls 45, 46 defining an angle greater than 40°. A light emitting diode chip is on the floor 42 of the package 40 and is designated at 47.

As in some of the other illustrated embodiments, the active portion of the light emitting diode 47 is formed from the Group III nitride material system and the package 40 will include electrical contacts (not shown in FIG. 8) between the floor 42 and at least one of the outside surfaces of the package 40.

In a strict geometric definition, a polygon is a figure with a plurality of sides that are line segments. Accordingly, because the end walls 45, 46 and the side walls 43, 44 of the packages (e.g., 40) in FIGS. 8 through 13 are curved, the phrase "solid polygon" is technically inappropriate for the recess 41. Accordingly, the recess 41 is better described as a three-dimensional solid with an aspect ratio greater than 1:1. As used herein, "aspect ratio" refers to the ratio of the longer dimension of the package to the shorter dimension of the package. Thus, in the terminology used herein, the end walls 45, 46 are along the shorter dimension of the package and the side walls 43, 44 are along the longer dimension.

Similarly, because the three-dimensional solid shape of the recess 41 does not necessarily fall into the category of regular curved shapes (e.g., circle, ellipse, parabola, etc.), the portions of the curved side walls 43, 44 and end walls 45, 46 that meet the angles set forth herein are defined by planes normal to the surface of the chip 47 in the package (e.g. 40).

Figure 14:
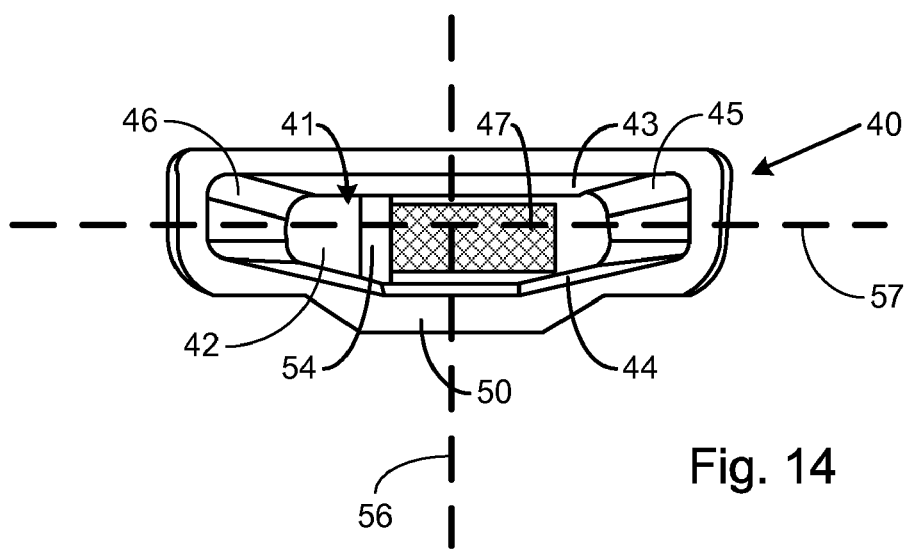
FIGS. 8-14 are respective top plan views of particular embodiments of packages according to the present invention.

FIG. 14 illustrates this geometry by reproducing FIG. 8, but while also superimposing the dotted lines 56 and 57 for purposes of illustrating the geometry of the angles in circumstances where the walls 43, 44, 45 and 46 are curved or include curved portions. In such circumstances, the horizontal line 57 represents the projection of a first plane bisecting the package 40 along its long axis and the vertical line 56 represents the projection of a second plane bisecting the package 40 along its narrow axis. In such packages, the angles between the end walls 45 and 46 are taken along the bisecting plane 57 and the angles between the side walls 43 and 44 are taken along the bisecting plane 56. This description is likewise appropriate for curved walls that are regular.

Although not illustrated in FIGS. 8-13, the embodiment can likewise include the resin encapsulant in at least portions of the recess 41 along with a phosphor in the encapsulant that emits light in the yellow portion of the visible spectrum in response to the blue light generated by the Group III nitride diode. Once again, an exemplary phosphor is cesium doped YAG and the package resin is typically polyamide.

In comparison to more conventional packages, the side walls 43, 44 and the end walls 45, 46 of the embodiment illustrated in FIG. 8 are thicker, as illustrated as the face perimeter 50 of the package 40. For example, a conventional package has sidewalls approximately 100 microns (µm) thick all the way to the floor, while those in FIG. 8 start at about 100 µm and become much thicker towards the floor. As understood in the art, the thicker sidewall increases the reflection of the package in a favorable manner and reduces light loss through the package. The thickness of the wall will be constrained somewhat by the desired angles of the walls 43, 44, 45, 46 because the floor 42 must still provide sufficient space for the LED chip 47.

As noted above, although the package 40 is substantially rectangular, it is not an exact rectangle. Furthermore, the floor 42 although rectangular in orientation is similarly not exactly rectangular. The diagonal lines (unnumbered) between the perimeter face 50 and the floor 42 are indicative of a curved geometry for portions of the walls 43, 44, 45, 46.

FIGS. 9 through 13 illustrate slightly different embodiments based primarily on the size and type of the chip being included. Stated differently, the package according to the invention can be modified in shape to favorably accommodate different size chips while still maintaining the favorable relationship geometry between and among the walls. Also, the larger angle design (e.g. FIG. 13) favors Lambertian emitters such as the EZBRIGHT™ chips available from Cree, Inc. (Durham, N.C.) while smaller angles (e.g. FIG. 8) favors non-Lambertian emitters.

Figure 9:
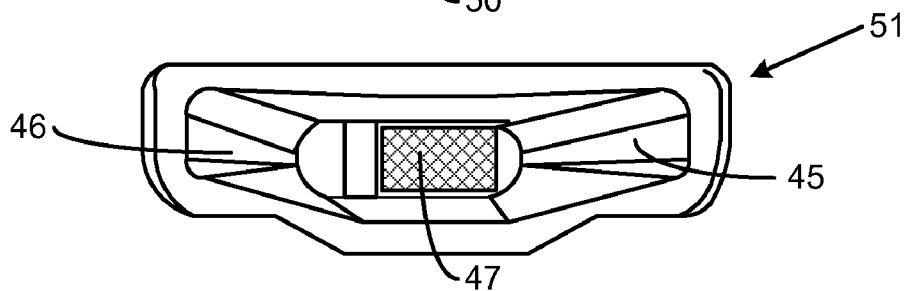

For the sake of comparison, in FIG. 9-13 like elements will carry the same reference numerals as they do in FIG. 8. Thus, FIG. 9 illustrates a package broadly designated at 51 in which the floor 42 is smaller (both shorter and more narrow) than the floor in FIG. 8 and therefore suitable for a smaller chip 47, and provides a larger angle for light extraction, especially between the end walls 45 and 46.

Figure 10:
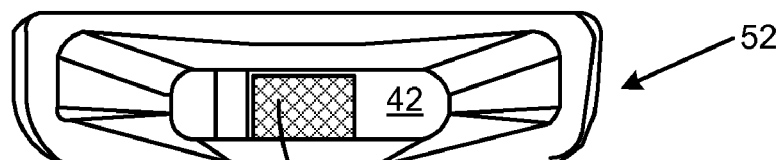
Figure 11:
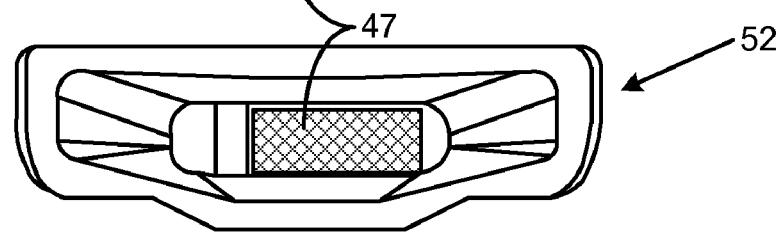

FIG. 10 shows another package broadly designated at 52 in which the floor 42 is somewhat longer than the floor 42 in FIG. 9, but generally the same width. FIG. 11 illustrates the same package 52 as FIG. 10, but with a larger chip 47 in place.

Figure 12:
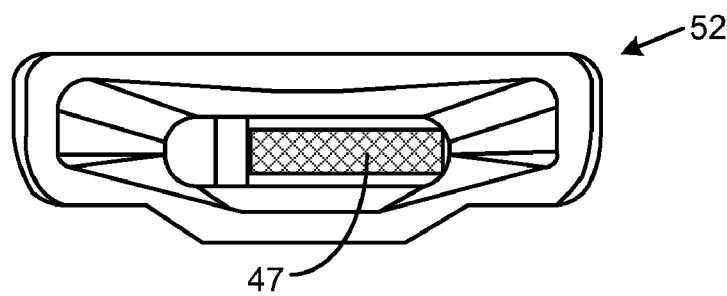

FIG. 12 is another illustration of the package 52 with the largest (longest) chip 47 on the floor 42.

Figure 13:
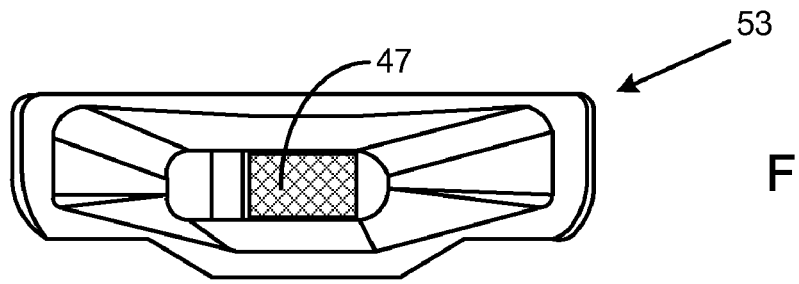

FIG. 13 shows a different embodiment of the package broadly designated at 53 with the perimeter face 50 being somewhat the same or thinner to allow the floor to be a desired size while still maintaining the desired large angles between the walls 43, 44, 45, 46.

As known to those familiar with the packages according to the invention, both the face of the package and the floor are for the most part open prior to having a chip mounted in them. In order to separate and isolate the chip wires, each of the packages in FIGS. 8-13 include an insulator 54 strip bridging the sidewalls 43, 44. This aspect of the design is well understood in the art and need not be described in further detail.

Figure 15:
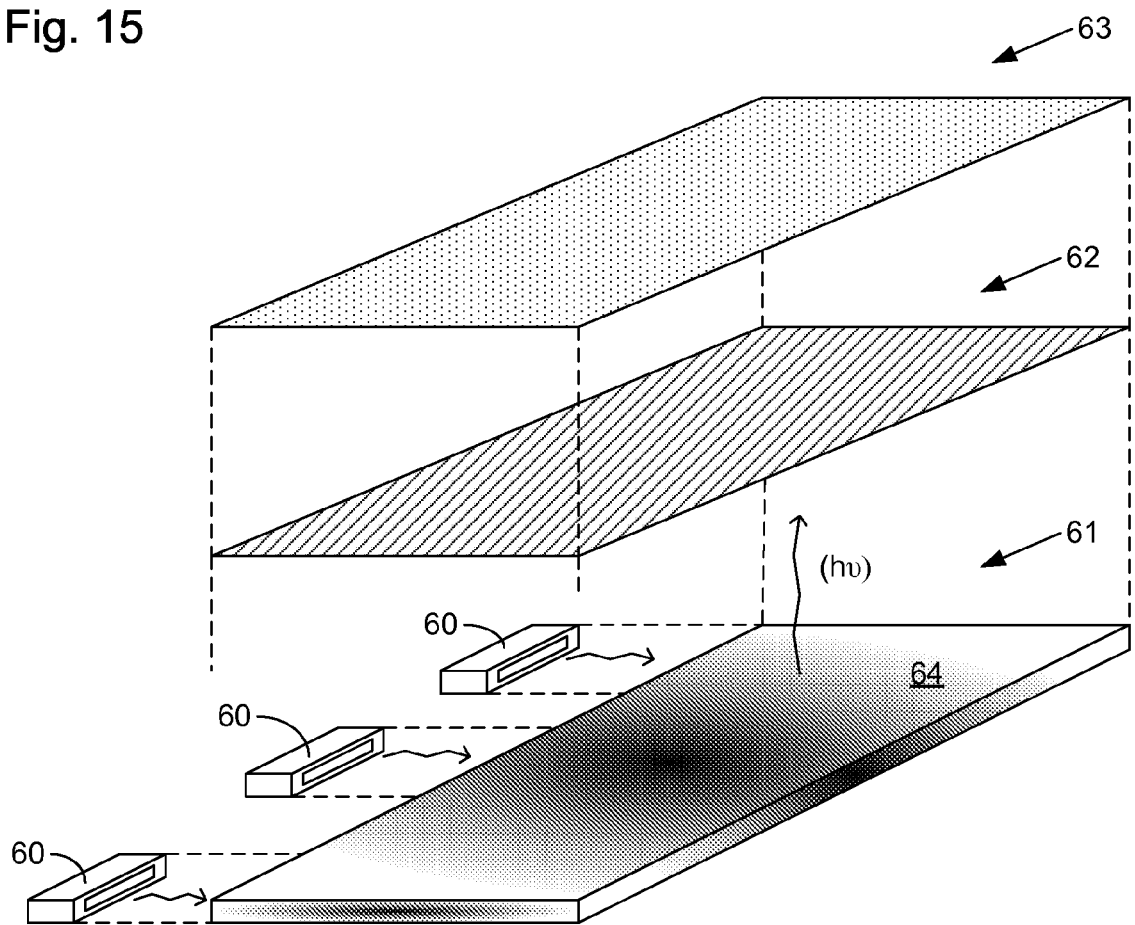
FIG. 15 is a schematic perspective diagram of a display incorporating diodes according to the present invention.

FIG. 15 is an exploded perspective and schematic diagram of a display that can incorporate packaged diodes according to the present invention. As noted earlier, embodiments of the invention are particularly useful in the sidelooker context. As illustrated in FIG. 15, the diode lamps 60 are oriented to direct light predominantly into the side of a light guide and diffuser 61. In particular, when used in a liquid crystal display, the diffuser 61 will be accompanied by a planar arrangement of liquid crystals schematically illustrated by the rectangle 62 and typically one or more other elements such as color filters represented by the rectangle 63 and potentially other components such as polarizers, a transparent cover sheet and a frame (not illustrated in the schematic view of FIG. 15).

In the sidelooker orientation, the longer dimensions of the generally rectangular or high aspect ratio diode lamps 60 are positioned adjacent the light guide 61 so that the display face 64 of the diffuser 61 is parallel to the predominant direction in which the diode lamps 60 emit light. The characteristics of the diffuser 61 are such that in addition to spreading the light from the diode lamps 60 throughout the diffuser 61, the diffuser 61 also redirects some of the light (hυ) in a perpendicular direction to illuminate the other elements 62 and 63.

In the drawings and specification there has been set forth a preferred embodiment of the invention, and although specific terms have been employed, they are used in a generic and descriptive sense only and not for purposes of limitation, the scope of the invention being defined in the claims.

The invention claimed is:

1. A light emitting diode lamp comprising:
   a resin package with an aspect ratio greater than 1:1 that defines a recess in the shape of a three dimensional solid;
   said recess comprising a floor with an aspect ratio greater than 1:1, side walls along the respective longer sides of said floor, and end walls along the respective shorter sides of said floor;
   said package defining a first plane bisecting said package along its long axis and a second plane bisecting said package along its narrow axis;
   said recess having a geometry wherein said side walls define an angle therebetween and along said second plane greater than 3° and said end walls define an angle therebetween and along said first plane great than 40°;
   a resin encapsulant in at least portions of said recess;
   a self-aligning light emitting diode chip on said floor of said package; and
   a phosphor in said resin encapsulant that emits light in response to the light emitted by said diode;
   wherein the footprint of said floor coincides with the size of said light emitting diode chip, and said footprint and the angles of said side walls and said end walls contribute to the alignment of said diode chip on said floor.

2. A light emitting diode according to claim 1 comprising curved end walls.

3. A light emitting diode according to claim 1 comprising curved side walls.

4. A light emitting diode according to claim 1 wherein:
   the active portion of said light emitting diode is formed from the Group III nitride material system; and
   said package further comprises electrical contacts between said floor and at least one outside surface of said package.

5. A light emitting diode lamp according to claim 1 wherein:
   said diode emits in the blue portion of the visible spectrum; said lamp further comprising:
      a resin encapsulant in at least portions of said recess; and
      said phosphor in said encapsulant emits light in the yellow portion of the visible spectrum in response to blue light.

6. A light emitting diode lamp according to claim 5 wherein said phosphor comprises cesium-doped YAG and said package resin comprises polyamide.

7. A light emitting diode lamp according to claim 1 wherein said respective sidewalls and end walls are thick enough to prevent light from said chip from being transmitted through said walls and instead to be reflected from said walls.

8. A light emitting diode lamp according to claim 1, wherein said light emitting diode lamp is incorporated into a display, said display comprising a light guide, wherein the longer dimension of said diode lamp is positioned adjacent said light guide with the display face of said light guide parallel to the predominant direction in which said diode lamp emits light.

9. A light emitting diode lamp according to claim 8 further comprising liquid crystals positioned to be illuminated by light emitted from said display face of said light guide.

10. A light emitting diode lamp according to claim 9 further comprising color filters positioned to be illuminated by light from said display face of said light guide.

11. A light emitting diode lamp comprising:
    a resin package that defines a recess in the shape of a solid polygon;
    said recess comprising a floor, side walls along the respective longer sides of said floor, and end walls along the respective shorter sides of said floor;
    said recess having a geometry wherein said side walls define an angle therebetween greater than 3° and said end walls define an angle therebetween greater than 40°;
    a resin encapsulant in at least portions of said recess;
    a self-aligning light emitting diode chip on said floor of said package; and
    a phosphor in said resin encapsulant that emits light in response to the light emitted by said diode;
    wherein the footprint of said floor coincides with the size of said light emitting diode chip, and said footprint and the angles of said side walls and said end walls contribute to the alignment of said diode chip on said floor.

12. A light emitting diode according to claim 11 wherein:
    the active portion of said light emitting diode is formed from the Group III nitride material system; and
    said package further comprises electrical contacts between said floor and at least one outside surface of said package.

13. A light emitting diode lamp according to claim 11 wherein:
    said diode emits in the blue portion of the visible spectrum; and
    said phosphor in said encapsulant emits light in the yellow portion of the visible spectrum in response to blue light.

14. A light emitting diode lamp according to claim 13 wherein said phosphor comprises cesium-doped YAG and said package resin comprises polyamide.

15. A light emitting diode lamp according to claim 11 wherein said respective sidewalls and end walls are thick enough to prevent light from said chip from being transmitted through said walls and instead to be reflected from said walls.

16. A reflective structure for diode lamps comprising:
    a package having at least one face that is substantially rectangular;
    said package defining a recess in the form of a solid polygon having a floor parallel to said face, two side walls along the respective longer edges of said face, two end walls along the respective shorter edges of said face; and
    a surface coplanar with said face;
    said recess having a geometry wherein said side walls define an angle therebetween greater than 3° and said end walls define an angle therebetween greater than 40°;
    a resin encapsulant in at least portions of said recess;
    a phosphor in said resin encapsulant;
    electrical contacts to said floor; and
    a self-aligning light emitting diode chip on said floor;
    wherein the footprint of said floor coincides with the size of said light emitting diode chip, and said footprint and the angles of said side walls and said end walls contribute to the alignment of said diode chip on said floor.

17. A reflective structure according to claim 16 wherein said package comprises a polymer resin.

18. A reflective structure according to claim 16 wherein said polymer resin comprises a polyamide.

19. A reflective structure according to claim 17 wherein said polymer resin includes a white pigment.

20. A reflective structure according to claim 16 wherein said sidewalls define an angle of at least 60°.

21. A reflective structure according to claim 16 wherein said sidewalls define an angle of at least 70°.

22. A reflective structure according to claim 16 wherein said sidewalls define an angle of at least 80°.

23. A reflective structure according to claim 16 wherein said end walls define an angle greater than 10°.

24. A reflective structure according to claim 16 wherein said end walls define an angle greater than 20°.

25. A reflective structure according to claim 16 wherein said end walls define an angle of at least 30°.

26. A side view surface mount lamp according to claim 1.

27. A side view surface mount lamp according to claim 11.

28. A light emitting diode lamp comprising:
a polyamide resin package with an aspect ratio greater than 1:1 that defines a recess in the shape of a three dimensional solid;
said recess comprising a floor with an aspect ratio greater than 1:1, side walls along the respective longer sides of said floor, and end walls along the respective shorter sides of said floor;
said package defining a first plane bisecting said package along its long axis and a second plane bisecting said package along its narrow axis;
said recess having a geometry wherein said side walls define an angle therebetween and along said second plane greater than 3° and said end walls define an angle therebetween and along said first plane greater than 40°;
a self-aligning light emitting diode chip on said floor of said package that emits in the blue portion of the visible spectrum;
a resin encapsulant in at least portions of said recess; and
a cesium-doped YAG phosphor in said encapsulant;
wherein the footprint of said floor coincides with the size of said light emitting diode chip, and said footprint and the angles of said side walls and said end walls contribute to the alignment of said diode chip on said floor.

29. A light emitting diode lamp comprising:
a polyamide resin package that defines a recess in the shape of a solid polygon;
said recess comprising a floor, side walls along the respective longer sides of said floor, and end walls along the respective shorter sides of said floor;
said recess having a geometry wherein said side walls define an angle therebetween greater than 3° and said end walls define an angle therebetween greater than 40°;
a self-aligning light emitting diode chip on said floor of said package that emits in the blue portion of the visible spectrum;
a resin encapsulant in at least portions of said recess; and
a cesium-doped YAG phosphor in said encapsulant;
wherein the footprint of said floor coincides with the size of said light emitting diode chip, and said footprint and the angles of said side walls and said end walls contribute to the alignment of said diode chip on said floor.

30. A light emitting diode lamp comprising:
a package with a recess, said recess comprising a floor, side walls, and end walls; and
a self-aligning light emitting diode chip on said floor of said package;
wherein the footprint of said floor coincides with the size of said light emitting diode chip, and said footprint and the angles of said side walls and said end walls contribute to the alignment of said diode chip on said floor.

* * * * *

UNITED STATES PATENT AND TRADEMARK OFFICE
CERTIFICATE OF CORRECTION

| | | |
|---|---|---|
| PATENT NO. | : 7,968,900 B2 | Page 1 of 1 |
| APPLICATION NO. | : 11/624954 | |
| DATED | : June 28, 2011 | |
| INVENTOR(S) | : Hussell et al. | |

It is certified that error appears in the above-identified patent and that said Letters Patent is hereby corrected as shown below:

On the Cover page, "(74) Attorney, Agent, or Firm" please correct the spelling of the name "Heybl" not Heyhl Signed and Sealed this
Sixteenth Day of August, 2011

David J. Kappos
*Director of the United States Patent and Trademark Office*